United States Patent
Morisada

(10) Patent No.: US 6,864,962 B2
(45) Date of Patent: Mar. 8, 2005

(54) ACTIVE ANTI-VIBRATION APPARATUS AND EXPOSURE APPARATUS AND DEVICE MANUFACTURING METHOD USING THE SAME

(75) Inventor: Masahiro Morisada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 10/073,976

(22) Filed: Feb. 14, 2002

(65) Prior Publication Data

US 2002/0140921 A1 Oct. 3, 2002

(30) Foreign Application Priority Data

Feb. 19, 2001 (JP) ........................................ 2001-041355

(51) Int. Cl.[7] .................. G03B 27/42; G03B 27/58; G03B 27/60; G03B 27/62
(52) U.S. Cl. ...................... 355/73; 355/53; 355/72; 355/75; 355/76
(58) Field of Search .......................... 355/53, 72, 73, 355/75, 76; 248/550; 267/136, 140.13; 700/280; 188/378

(56) References Cited

U.S. PATENT DOCUMENTS

| | | | |
|---|---|---|---|
| 5,876,012 A | * | 3/1999 | Haga et al. .................. 248/550 |
| 5,936,710 A | | 8/1999 | Itoh et al. ...................... 355/53 |
| 6,128,552 A | * | 10/2000 | Iwai et al. .................. 700/280 |
| 6,160,612 A | | 12/2000 | Itoh et al. ...................... 355/53 |
| 6,322,060 B1 | * | 11/2001 | Mayama et al. ............. 267/136 |
| 6,364,294 B1 | * | 4/2002 | Gennesseaux et al. . 267/140.13 |
| 6,378,672 B1 | * | 4/2002 | Wakui ........................ 188/378 |

FOREIGN PATENT DOCUMENTS

| | | |
|---|---|---|
| JP | 11-72136 | 3/1999 |
| JP | 11-264444 | 9/1999 |

* cited by examiner

Primary Examiner—Rodney Fuller
(74) Attorney, Agent, or Firm—Fitzpatrick, Cella, Harper & Scinto

(57) ABSTRACT

An anti-vibration apparatus includes a table, a pneumatic spring for applying a force to the table, an electromagnetic actuator for applying a force to the table, and a first generator which generates a driving signal for the electromagnetic actuator based on at least one of a target position and a target speed with respect to a movable object on the table.

10 Claims, 8 Drawing Sheets

FIG. 2
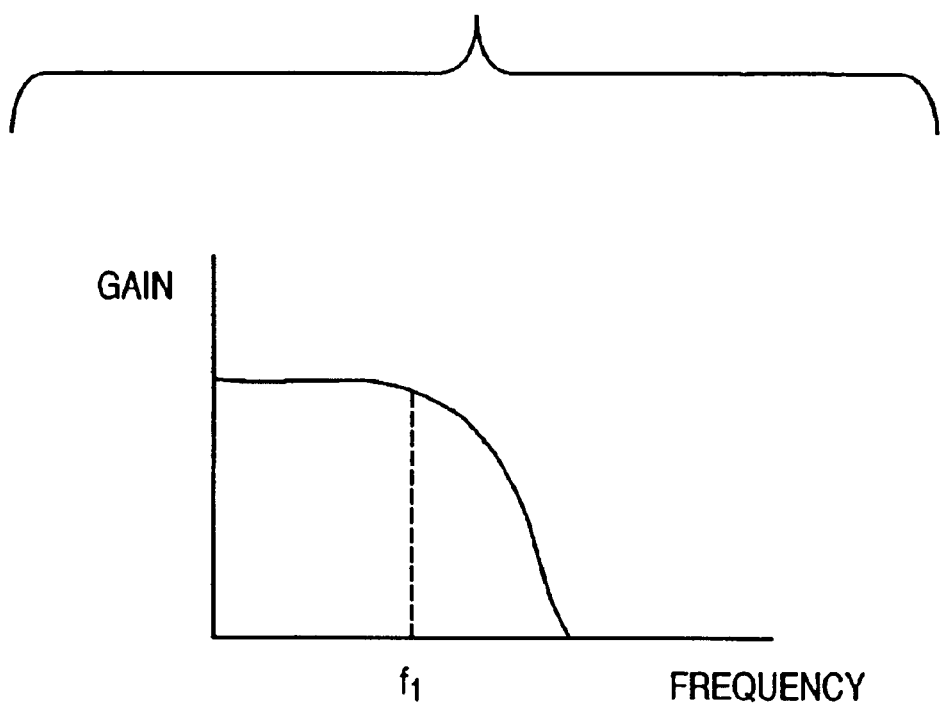
FREQUENCY CHARACTERISTICS OF FILTER 40
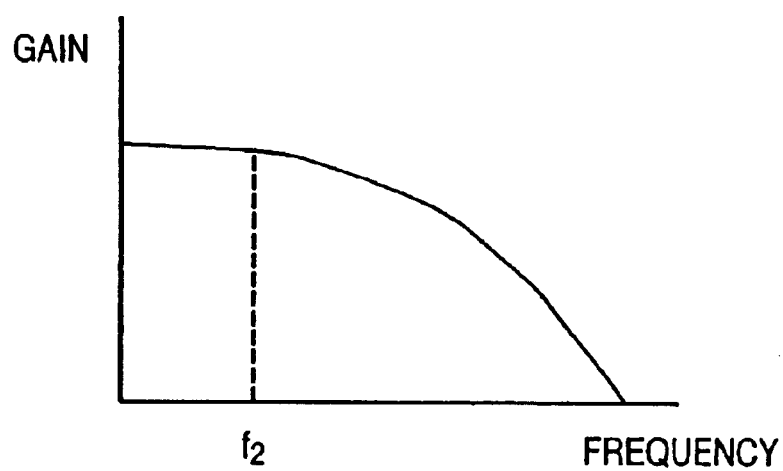
FREQUENCY CHARACTERISTICS OF FILTER 41

FIG. 4
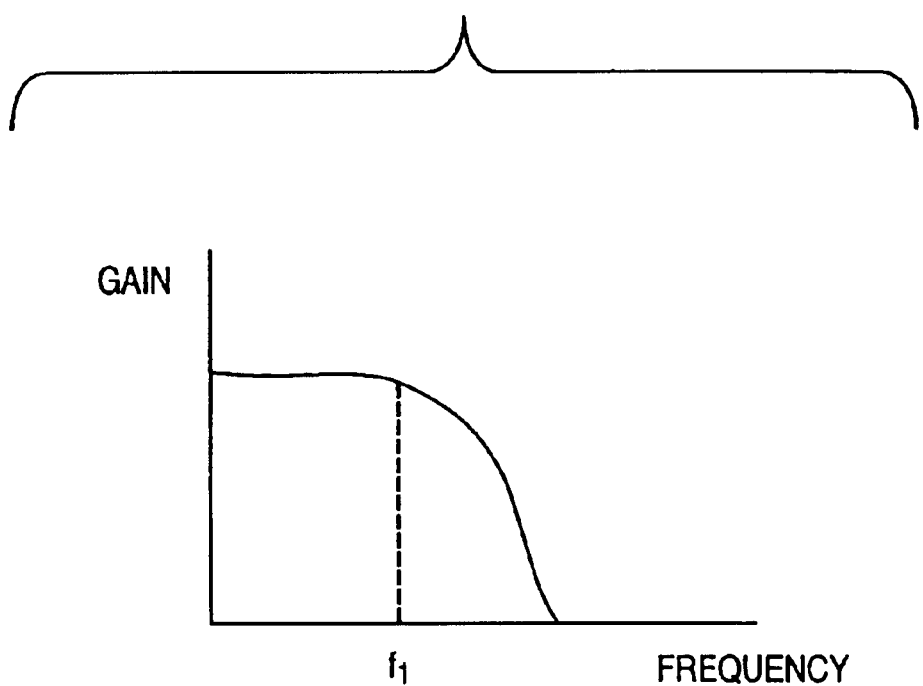
FREQUENCY CHARACTERISTICS OF FILTER 40
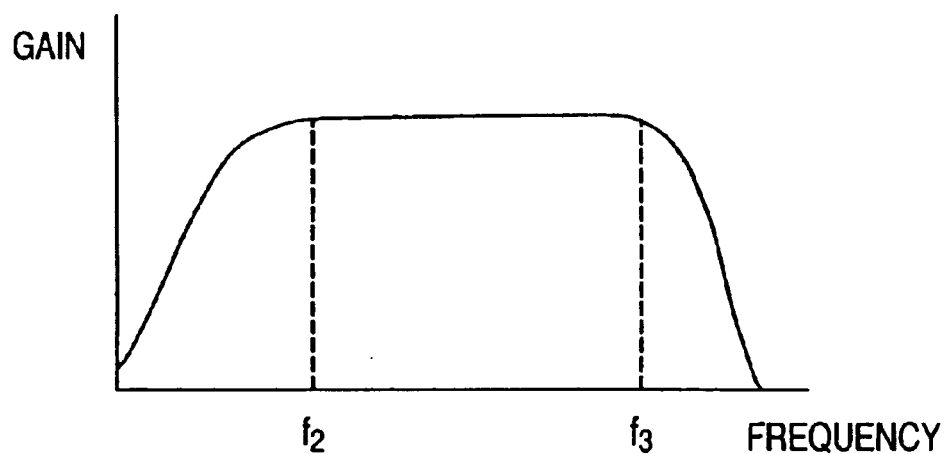
FREQUENCY CHARACTERISTICS OF FILTER 41

SEMICONDUCTOR DEVICE MANUFACTURING FLOW

WAFER PROCESS

ACTIVE ANTI-VIBRATION APPARATUS AND EXPOSURE APPARATUS AND DEVICE MANUFACTURING METHOD USING THE SAME

FIELD OF THE INVENTION

The present invention relates to an anti-vibration apparatus used in an exposure apparatus or the like which mounts positioning equipment such as an optical microscope or X-Y stage and manufactures a device such as a semiconductor device, and to an improvement in an active anti-vibration apparatus which can effectively suppress vibration caused by the motion of the equipment mounted on the anti-vibration apparatus. The present invention also relates to an exposure apparatus and a device manufacturing method using the active anti-vibration apparatus.

BACKGROUND OF THE INVENTION

In an apparatus formed by mounting an optical microscope or exposure X-Y stage on an anti-vibration table, externally transmitted vibration must be eliminated as much as possible. An apparatus in which an exposure X-Y stage is mounted on an anti-vibration table has intermittent operations called step & repeat or step & scan as a driving mode. It should be noted that the apparatus itself generates vibration because of repeated step or scan, thus vibrating the anti-vibration table. Unless this vibration is eliminated, exposure cannot be performed. The anti-vibration table is therefore required to realize anti-vibration against external vibration and vibration control against forced vibration caused by the motion of the equipment itself mounted on the anti-vibration table with a good balance.

Anti-vibration tables are classified into passive anti-vibration tables and active anti-vibration tables. Recently, to meet demands such as high-precision positioning, high-precision scanning, high-speed movement, and the like, for the equipment mounted on the anti-vibration table, an active anti-vibration apparatus tends to be used. An example of an actuator for driving the anti-vibration table includes a pneumatic spring, a voice coil motor, a piezoelectric element, and the like.

FIG. 7 shows the arrangement of Japanese Patent Laid-Open No. 11-264444 disclosing a conventional active anti-vibration apparatus.

Referring to FIG. 7, reference numerals 1 and 8 denote pneumatic spring type support legs; 2 and 9, servo valves for supplying and exhausting air as the working fluid to and from pneumatic springs 3 and 10; 4 and 11, position sensors for measuring the vertical displacement of an anti-vibration table 15 at their measurement points; 5 and 12, mechanical springs for pre-pressurizing; 6, a viscous element for expressing the viscosities of the pneumatic spring 3, mechanical spring 5, and pneumatic spring type support leg 1; and 13, a viscous element for expressing the viscosities of the pneumatic spring 10, mechanical spring 12, and pneumatic spring type support leg 8.

Reference numerals 7 and 14 denote acceleration sensors; 16, a stage which moves in the horizontal direction on the anti-vibration table 15; 17, a position sensor for measuring the horizontal displacement of the stage 16; 18, a motor for driving the stage 16; 19, a displacement amplifier for amplifying a stage displacement; 20, a PID compensator; 21, an amplifier; 22, a target speed generator for generating the target speed of the stage 16 on the basis of an operation profile generated by a stage sequence controller 37; and 23, an integrator, respectively.

Reference numerals 24 and 25 denote displacement amplifiers; 26, a displacement decomposer; 27 and 28, PI compensators; 29 and 30, filters; 31, an acceleration decomposer; 32, a thrust distributor; and 33 and 34, amplifiers, respectively.

Reference numeral 35 denotes a target position setter for generating the target position of the anti-vibration table 15; and 36, a filter with a predetermined appropriate gain and time constant.

The above constituent elements 1 to 18 in FIG. 7 are schematically illustrated as the active anti-vibration apparatus is seen just from its side. The pneumatic spring type support legs 1 and 8 support the anti-vibration table 15 in the vertical direction.

The operation of the pneumatic spring type anti-vibration apparatus shown in FIG. 7 will be described. For the sake of convenience, the moving direction of the stage 16, the vertical direction, and an axis extending through the barycenter of the anti-vibration table 15 and perpendicular to the moving direction of the stage 16 within a horizontal plane are respectively defined as X-, Z-, and Y-axes. An axis of rotation about the Y-axis is defined as a θy-axis.

Outputs from the acceleration sensors 7 and 14 respectively pass through the filters 29 and 30, each having a predetermined appropriate gain and time constant, and are input to the acceleration decomposer 31. The acceleration decomposer 31 decomposes the two inputs into a Z-direction acceleration and a θy-direction angular acceleration by 2×2 multiply matrix operation, and negatively feeds them back to the input of the thrust distributor 32. This acceleration feedback loop adds damping.

Outputs from the position sensors 4 and 11 respectively pass through the displacement amplifiers 24 and 25 and are input to the displacement decomposer 26. The displacement decomposer 26 decomposes the two inputs into a Z-direction displacement and a θy-direction rotational displacement by 2×2 multiply matrix operation.

The target position setter 35 sets target positions for the vertical displacement and rotational displacement. Deviation signals of the target positions with respect to outputs from the displacement decomposer 26 pass through the PI compensators 27 and 28 and are input to the thrust distributor 32.

The thrust distributor 32 distributes Z- and θy-direction thrust target values to the driving target values of the pneumatic springs 3 and 10. The distributed driving target values are converted by the amplifiers 33 and 34 into driving currents for the servo valves 2 and 9, respectively. When the servo valves 2 and 9 are opened or closed, the pressures in the pneumatic springs 3 and 10 are adjusted. Thus, the anti-vibration table 15 can be held at the desired position set by the target position setter 35 without any steady deviation.

The PI compensators 27 and 28 operate as a control compensator for the Z-axis displacement and a control compensator for the θy-axis displacement, respectively.

An output from the position sensor 17 passes through the displacement amplifier 19, and its deviation with respect to a target position signal generated by the integrator 23 is input to the PID compensator 20. An output from the PID compensator 20 passes through the amplifier 21 and drives the stage 16 through the motor 18. P, I, and D of the PID compensator 20 mean proportional, integral, and derivative, respectively. The target speed generator 22 generates the target speed of the stage 16 on the basis of the operation profile generated by the stage sequence controller 37. The target speed of the stage 16 is integrated by the integrator 23 to become the target position of the stage 16. The target speed of the stage 16 is feed-forwarded to a θy-axis displacement control system through the filter 36.

The intermediate portion of FIG. 8 is a graph showing the target speed generated by the target speed generator 22 by plotting the time along the axis of abscissa. This speed pattern is known as a trapezoidal speed pattern. The upper and lower portions of FIG. 8 show a target acceleration as the differential value of the target speed and a target position as the integral value of the target speed. The target speed is converted into the target position through the integrator 23, and is input to a position control system for the stage 16.

It is generally known that, when the pneumatic springs 3 and 10 are in the equilibrium state, a transfer function from an input current I of the servo valves 2 and 9 to a pressure P of the pneumatic springs 3 and 10 can be approximated by integral characteristics as the following equation (1):

$$\frac{P}{I} = Gq \frac{kP_0}{V_0 s} \qquad (1)$$

where Gq is the flow rate gain of the servo valve, k is the specific heat of air, $P_0$ is the pressure of the pneumatic spring in the equilibrium state, $V_0$ is the volume of the pneumatic spring in the equilibrium state, and s is the Laplacian operator.

Therefore, the target speed feed-forwarded to the rotational displacement control system of the anti-vibration table 15 is integrated by the integral characteristics of the pneumatic spring 10 of equation (1) Feed-forwarding the target value is equivalent to giving the anti-vibration table 15 a rotational torque proportional to the position of the stage 16. Feed-forwarding of the target speed can cancel the rotational moment generated by the movement of the stage 16. The vibration of the anti-vibration table 15 can thus be effectively suppressed.

Japanese Patent Laid-Open No. 11-72136 discloses that a change in barycenter of the whole anti-vibration table 15 is obtained from the position of the stage 16, and that the pressure of the pneumatic spring is adjusted in accordance with this change.

In a recent exposure apparatus used in the manufacture of a device such as a semiconductor device, to improve the exposure throughput, the moving speed of the stage becomes high. Particularly, when, e.g., the moving speed of a movable portion such as the stage exceeds the pressure change speed of the pneumatic spring, the pneumatic spring cannot follow its driving signal, and sometimes compensation of the moving load by means of the pneumatic spring undesirably vibrates the anti-vibration table.

SUMMARY OF THE INVENTION

It is an object of the present invention to eliminate problems in the above prior art from the active anti-vibration apparatus.

According to the present invention, the foregoing object is attained by providing an active anti-vibration apparatus comprising: an anti-vibration table; a movable portion mounted on the anti-vibration table; a pneumatic spring for supporting and driving the anti-vibration table; a servo valve for adjusting a pressure of the pneumatic spring; an electromagnetic actuator for applying a force to the anti-vibration table; a displacement sensor for detecting displacement of the anti-vibration table; an anti-vibration table displacement controller for generating a driving signal for the servo valve on the basis of an output from the displacement sensor so that the anti-vibration table keeps a predetermined posture at a predetermined position; and an anti-vibration table vibration controller for generating a driving signal for the electromagnetic actuator, wherein both the servo valve and the electromagnetic actuator are so controlled as to compensate for movement of a load that occurs when the movable portion moves on the anti-vibration table.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

FIG. 2 includes graphs showing the frequency characteristics of the filters of FIG. 1;

FIG. 4 includes graphs showing the frequency characteristics of the filters of FIG. 3;

DETAILED DESCRIPTION OF THE PREFERRED EMBODIMENTS

Figure 1:
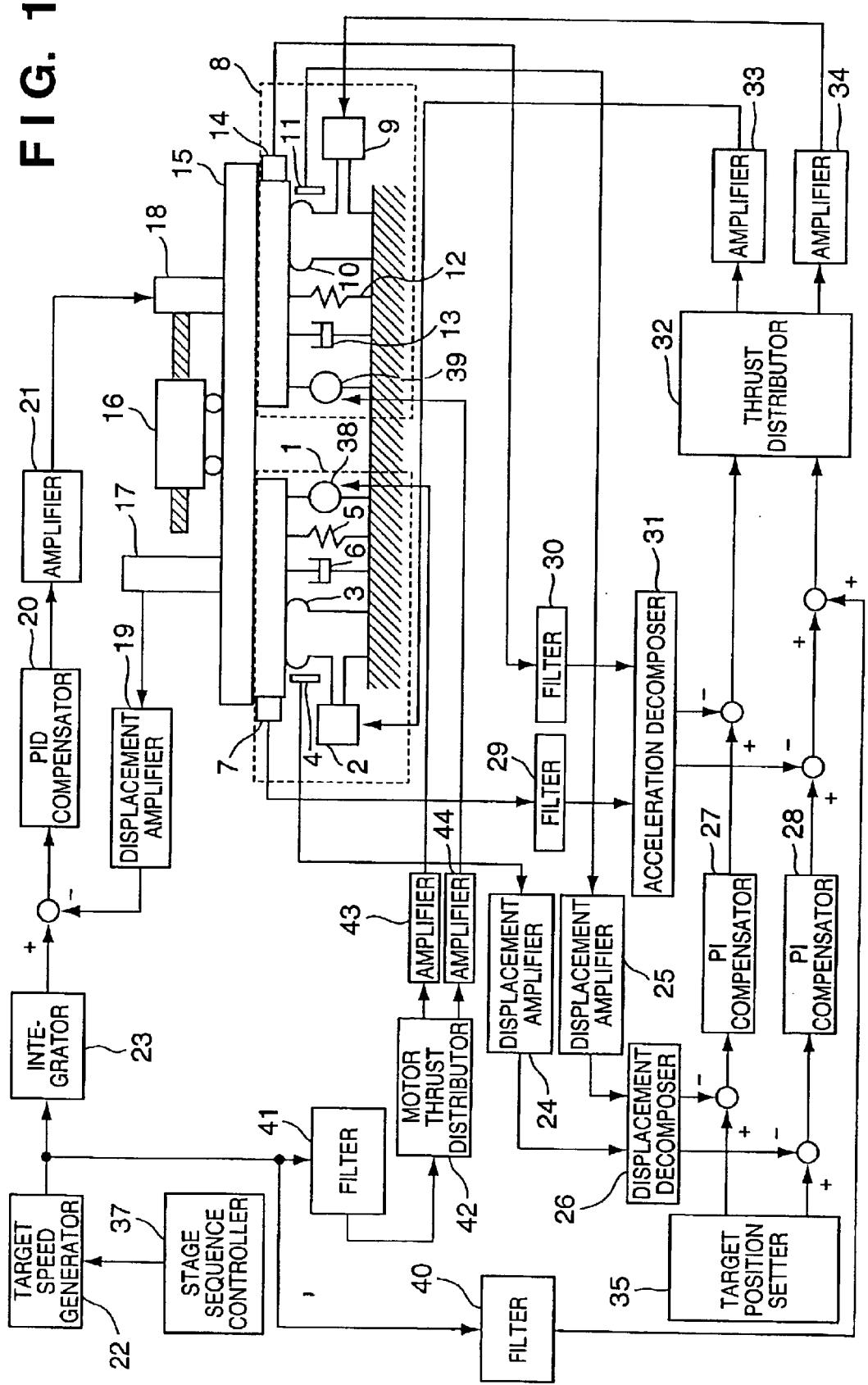
FIG. 1 is a view showing the arrangement of an active anti-vibration apparatus according to the first embodiment of the present invention.

According to the present invention, the drawback of compensating for the movable load with the pneumatic spring is compensated for by driving with an electromagnetic actuator. For example, even when the moving speed of a movable portion that can move on an anti-vibration table is high, the vibration of the anti-vibration table caused by the movement of the barycenter of the anti-vibration table as a whole can be suppressed.

According to a preferred embodiment of the present invention, as the movable portion, a stage mounted on the anti-vibration table can be used, and a driving means for driving the stage, a position sensor for detecting a position of the stage, and a stage position controller for controlling the position of the stage on the basis of an output from the position sensor so as to coincide with a predetermined target position are further provided. The movable portion can thus be moved to the target position of the stage.

The electromagnetic actuator applies to the anti-vibration table a force in the same direction as a support direction of said pneumatic spring and/or a direction perpendicular to the above direction. Thus, the drawback of compensating for the movable load with the pneumatic spring can be compensated for by driving with the electromagnetic actuator.

The active anti-vibration apparatus further comprises an acceleration sensor for detecting an acceleration of the anti-vibration table. The anti-vibration table displacement controller generates a driving signal for the servo valve on the basis of an output from the displacement sensor and/or the acceleration sensor, so that the anti-vibration table can keep a predetermined posture at a predetermined position.

In the active anti-vibration apparatus, at least one of a target position and a target speed of the movable portion is feed-forwarded to the anti-vibration table displacement controller and the anti-vibration table vibration controller. Thus, the rotational moment caused by the movement of the stage can be canceled, and the drawback of compensating for the movable load with the pneumatic spring can be compensated for by driving with the electromagnetic actuator.

A signal that at least one of a target position and a target speed of the movable portion is passed through a predetermined filter is feed-forwarded to the anti-vibration table displacement controller and anti-vibration table vibration controller.

In the active anti-vibration apparatus, as the filter, either first and second high-pass filters, low- and high-pass filters, first and second low-pass filters, or a low-pass filter may be used. A signal obtained by passing the target speed of the movable portion through one or a plurality of filters is preferably feed-forwarded to the anti-vibration table displacement controller and the anti-vibration table vibration controller.

When the filter includes the first and second high-pass filters, their cutoff frequencies are preferably almost equal. When the filter includes the low- and high-pass filters, their cutoff frequencies are preferably almost equal. When the filter includes the first and second low-pass filters, their cutoff frequencies are preferably almost equal. In any case, the cutoff frequency is preferably a predetermined value in a controllable frequency range of the pneumatic spring.

In the present invention, the low- and/or high-pass filter described above includes not only a low- and/or high-pass filter in a narrow sense but also a low-pass filter portion of a bandpass filter and a high-pass filter portion of a bandpass filter.

The embodiments of the present invention will be described in detail with reference to the accompanying drawings.

[First Embodiment]

Figure 7:
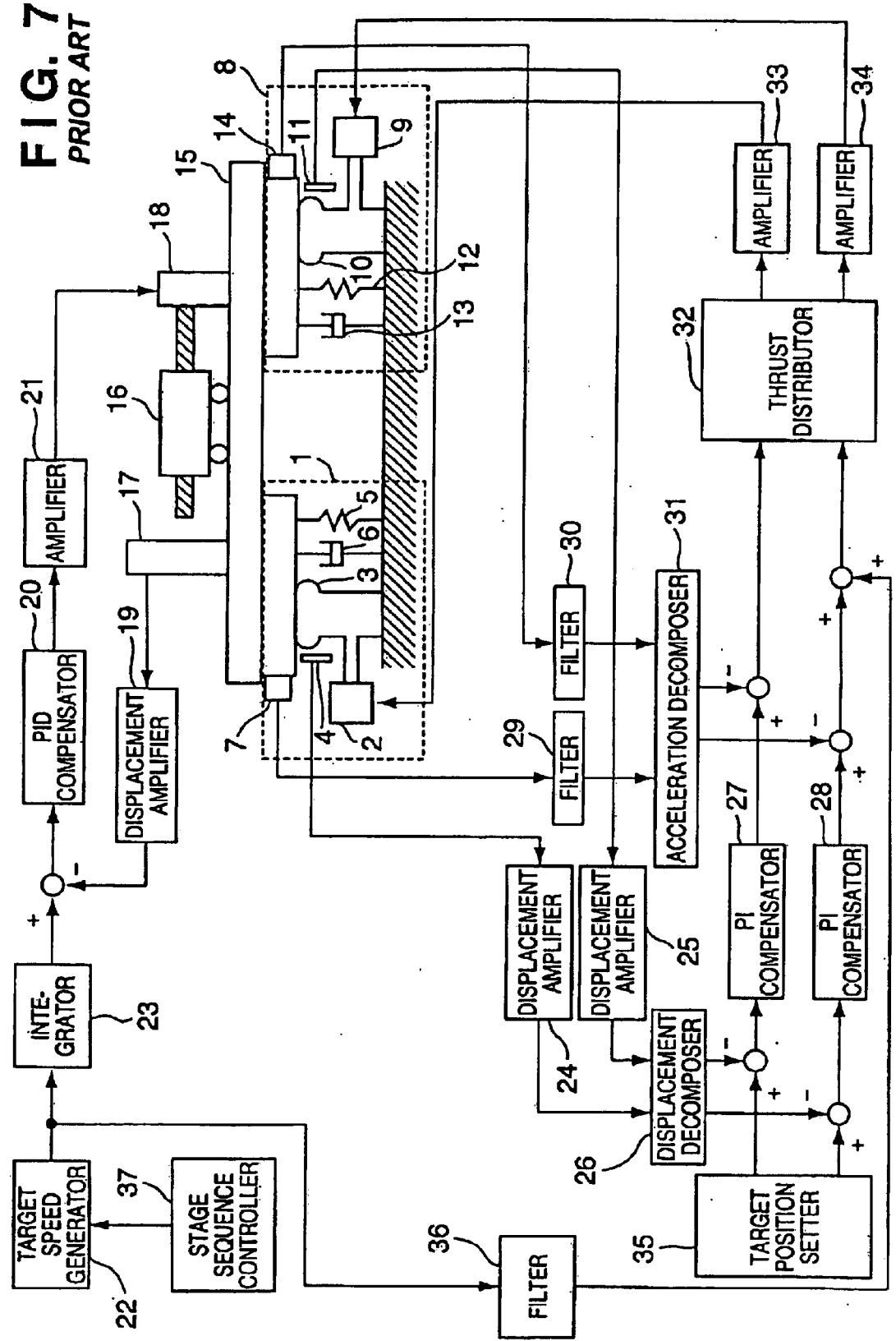
FIG. 7 is a view showing the arrangement of a pneumatic spring type anti-vibration apparatus as a conventional active anti-vibration apparatus.
Figure 8:
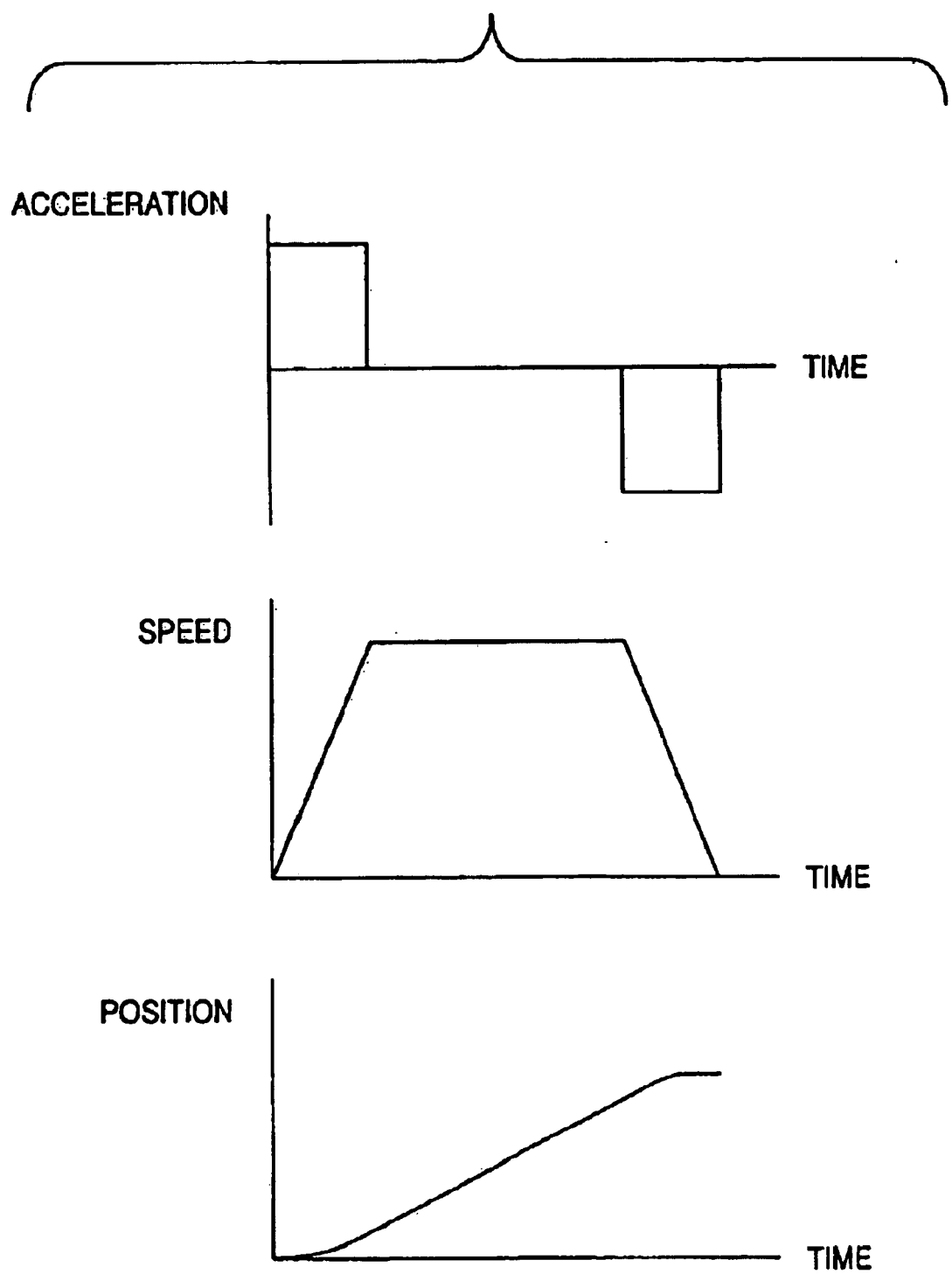
FIG. 8 includes graphs showing a target speed generated by the target speed generator of FIG. 7, and corresponding target acceleration and target position.

FIG. 1 is a view showing the arrangement of an active anti-vibration apparatus according to the first embodiment of the present invention. The same reference numerals as in FIG. 7 denote the same constituent elements in FIG. 1.

Referring to FIG. 1, reference numerals 38 and 39 denote voice coil motors serving as electromagnetic actuators; 40, a filter with low-pass characteristics; 41, a filter with first order low-pass characteristics; 42, a motor thrust distributor; and 43 and 44, amplifiers, respectively. This embodiment relates to an active anti-vibration apparatus using pneumatic springs and electromagnetic actuators as actuators, and will be described hereinafter.

The target speed of a stage 16 is generated by a target speed generator 22 on the basis of an operation profile generated by a stage sequence controller 37, and is input to the filter 40. A component equal to or lower than a predetermined frequency $f_1$ is feed-forwarded to a θy-axis control system, which drives pneumatic springs 3 and 10, by the low-pass characteristics.

The target speed of the stage 16 is also input to the filter 41. A component equal to or lower than a predetermined frequency $f_2$ is feed-forwarded to a θy-axis control system, which drives the voice coil motors 38 and 39, by the first order low-pass characteristics.

FIG. 2 shows the frequency characteristics of the filters 40 and 41. In this embodiment, the frequencies $f_1$ and $f_2$ are equal. Either frequency is in a controllable frequency range of the pneumatic springs 3 and 10.

The pneumatic springs 3 and 10 approximately have integral characteristics. This is equivalent to the following operation. The pneumatic springs 3 and 10 give rotational torque proportional to the position of the stage 16 in a band of the frequency $f_1$ or less, and the voice coil motors 38 and 39 give the same in a band of the frequency $f_2$ or more. Because of this feed-forward input of the target speed, even when the moving speed of the stage 16 is high, the rotational moment generated by the movement of the stage 16 can be canceled, so the vibration of the anti-vibration table 15 can be suppressed effectively. Since the filters are not high-pass filters but low-pass filters, they are less influenced by RF noise.

If the frequencies $f_1$ and $f_2$ are equal and the filter 40 is a first order low-pass filter, the filters 40 and 41 can be implemented by only one filter.

[Second Embodiment]

Figure 3:
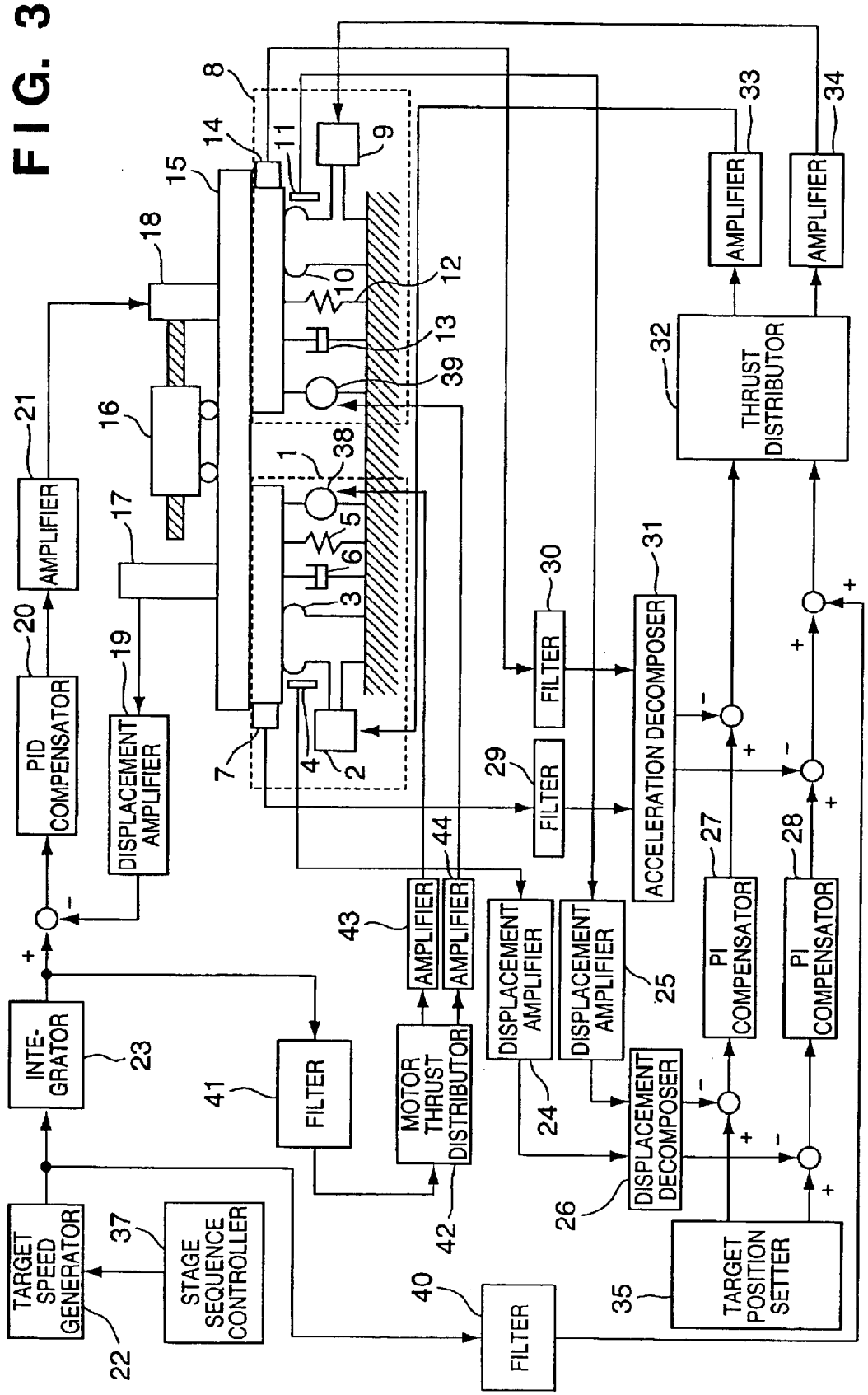
FIG. 3 is a view showing the arrangement of an active anti-vibration apparatus according to the second embodiment of the present invention.

FIG. 3 is a view showing the arrangement of an active anti-vibration apparatus according to the second embodiment of the present invention.

Referring to FIG. 3, reference numeral 40 denotes a filter with low-pass characteristics; and 41, a filter with bandpass characteristics. Other constituent elements are identical to those in FIG. 1 unless otherwise specified.

The target speed of a stage 16 is generated by a target speed generator 22 on the basis of an operation profile generated by a stage sequence controller 37, and is input to the filter 40. A component equal to or lower than a predetermined frequency $f_1$ is feed-forwarded to a θy-axis control system, which drives pneumatic springs 3 and 10, by the low-pass characteristics.

The filter 40 may be a bandpass filter that passes a predetermined frequency or more and the frequency $f_1$ or less. The target position of the stage 16 is input to the filter 41. A component equal to or higher than a predetermined frequency $f_2$ and equal to or lower than a predetermined frequency $f_3$ is feed-forwarded to a θy-axis control system, which drives the coil motors 38 and 39, by the bandpass characteristics.

FIG. 4 shows the frequency characteristics of the filters 40 and 41. In this embodiment, the frequencies $f_1$ and $f_2$ are equal. Either frequency is in a controllable frequency range of the pneumatic springs 3 and 10.

The pneumatic springs 3 and 10 approximately have integral characteristics. This is equivalent to the following operation. The pneumatic springs 3 and 10 give rotational torque proportional to the position of the stage 16 in a band of the frequency $f_1$ or less, and the voice coil motors 38 and 39 give the same in a band of the frequency $f_2$ or more. In order to suppress generation of a high-frequency vibration from the motor 18, a component of the feed-forwarded frequency $f_3$ or more at the target position is removed. Because of this feed-forward input of the target speed and that of the target position, even when the moving speed of the stage 16 is high, the rotational moment generated by the movement of the stage 16 can be canceled. The vibration of the anti-vibration table 15 can therefore be suppressed effectively.

Although the number of support legs for supporting the anti-vibration table in the vertical direction is two in the first and second embodiments described above, it may be three or more. When there are three support legs in the vertical direction, the position control system of the anti-vibration table includes three control systems, i.e., a Z-direction translation control system, a control system for rotation about the X-axis, and a control system for rotation about the Y-axis. In this case, a displacement decomposer, an acceleration decomposer, and a thrust distributor perform 3×3 matrix multiply operation.

The pneumatic spring and/or electromagnetic actuators for supporting the anti-vibration table may be mounted such that they drive the anti-vibration table not only in the vertical direction but also in the horizontal direction. When a pneumatic spring and/or electromagnetic actuator is provided in the horizontal direction, the vibration of the anti-vibration table in the horizontal direction can be suppressed.

Regarding the moving direction of the stage, the stage may be, e.g., an X-Y stage which moves two-dimensionally on a plane. When there are three support legs in the vertical direction, the X- and Y-axis target speeds of the X-Y stage are feed-forwarded to the θx- and θy-axis control systems, respectively, of the X-Y stage. Hence, the rotational moment caused by the movement of the barycenter upon movement of the X-Y stage can be canceled.

The present invention can also be applied to an exposure apparatus formed by mounting an X-Y table on the above active anti-vibration apparatus to manufacture a semiconductor device by projecting a pattern onto a substrate on the X-Y stage by using a projection optical system.

The exposure system of the exposure apparatus in this case includes the step & repeat system and step & scan system.

[Application of the Exposure Apparatus]

A semiconductor device manufacturing process utilizing the above exposure apparatus will now be described.

Figure 5:
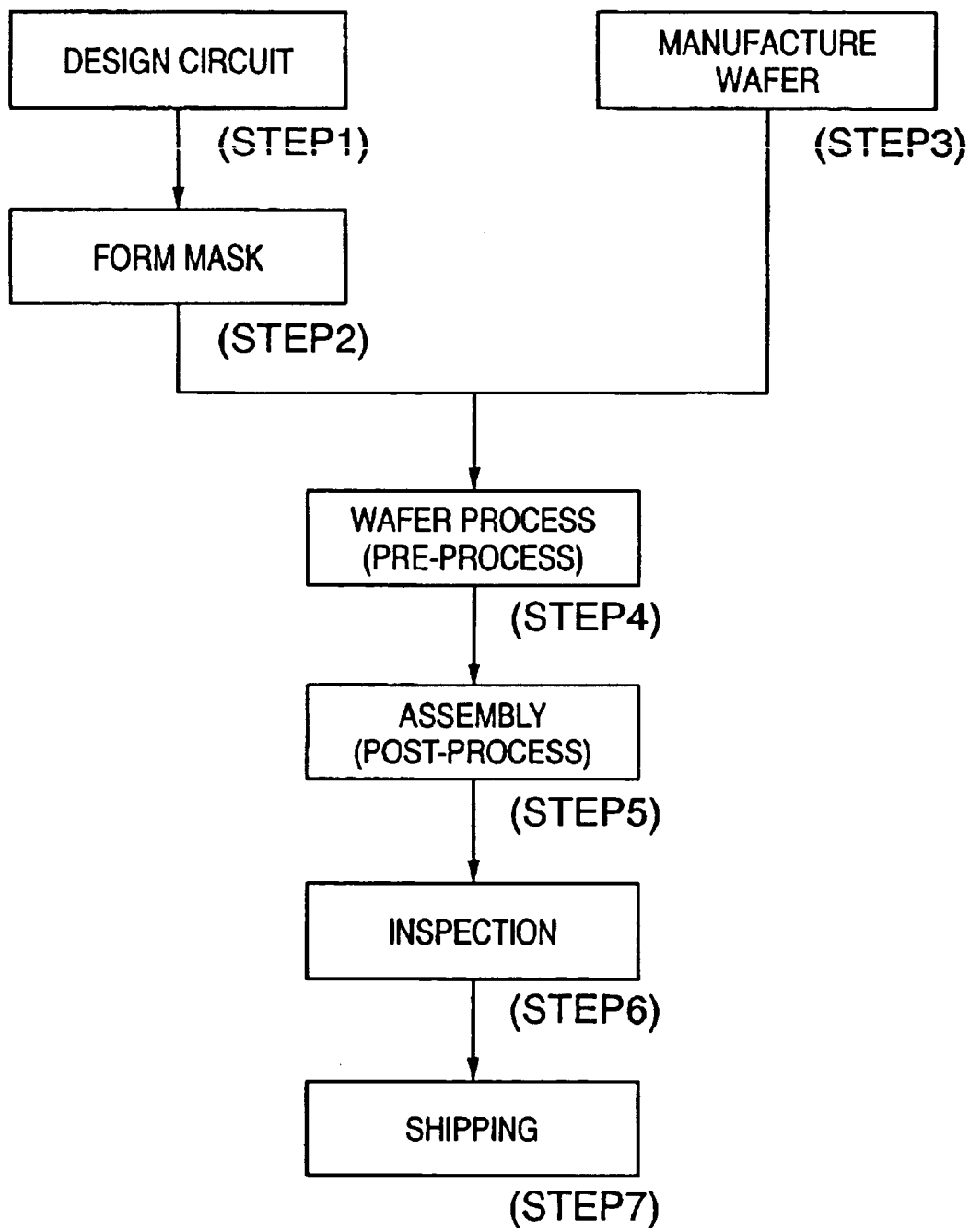
FIG. 5 is a flow chart showing an overall manufacturing process of a semiconductor device.

FIG. 5 shows the flow of an overall manufacturing process of a semiconductor device.

In step 1 (design circuit), a semiconductor device circuit is designed. In step 2 (form mask), a mask is formed on the basis of the designed circuit pattern. In step 3 (manufacture wafer), a wafer is manufactured by using a material such as silicon. In step 4 (wafer process), called a pre-process, an actual circuit is formed on the wafer by lithography using the prepared mask and wafer.

Step 5 (assembly), called a post-process, is the step of forming a semiconductor chip by using the wafer manufactured in step 4, and includes processes such as an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped, in step 7.

Figure 6:
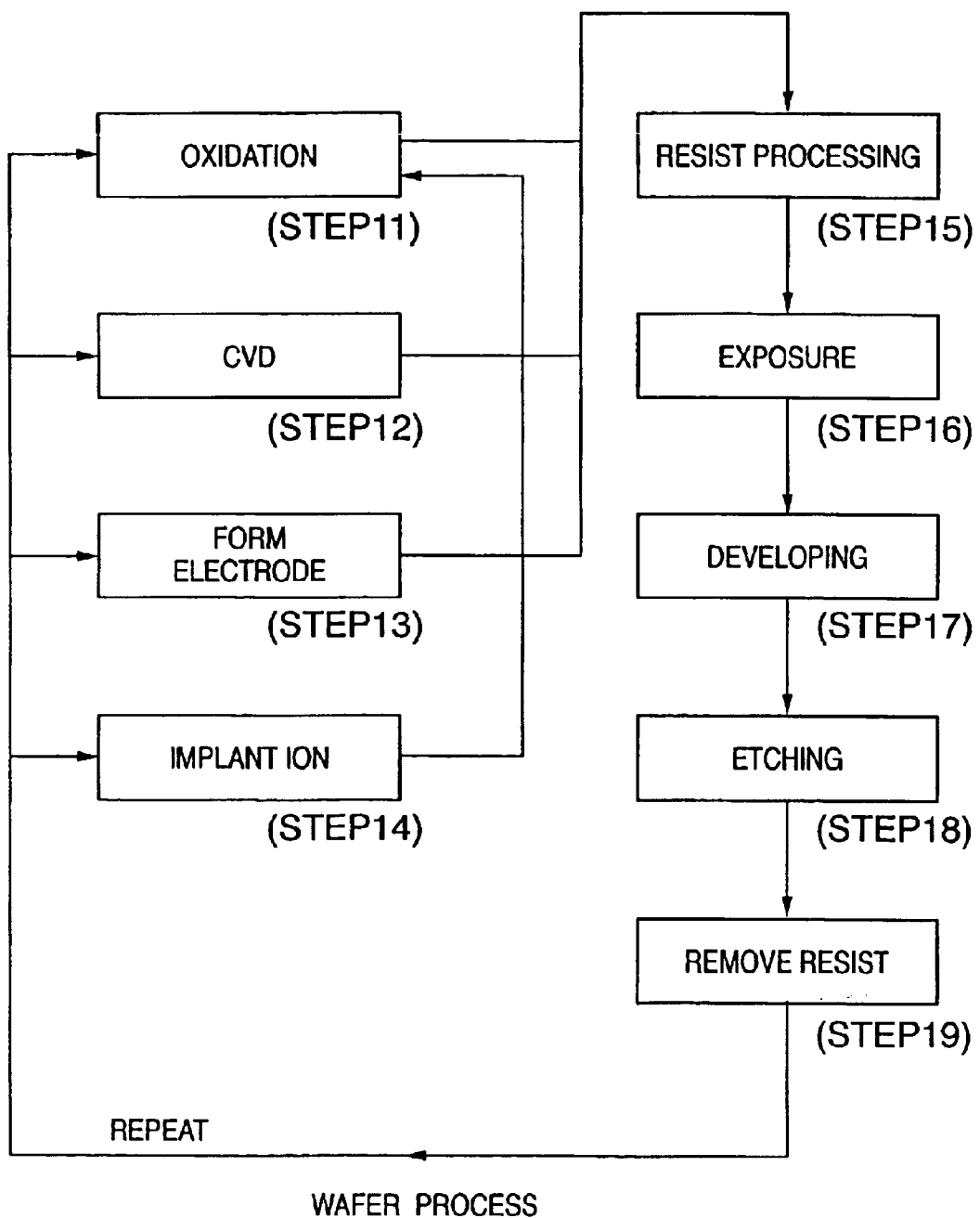
FIG. 6 is a flow chart of an overall manufacturing process of the semiconductor device.

FIG. 6 shows the detailed flow of the wafer process.

In step 11 (oxidation), the surface of the wafer is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer.

In step 16 (exposure), the above-mentioned exposure apparatus transfers the circuit pattern to the wafer. In step 17 (developing), the exposed wafer is developed. In step 18 (etching), the resist is etched except for the developed resist image. In step 19 (remove resist), an unnecessary resist after etching is removed. These steps are repeated to form multiple circuit patterns on the wafer.

As has been described above, according to the present invention, an active anti-vibration apparatus can be provided, in which the target position and/or target speed of the movable portion of the stage or the like is feed-forwarded to a control system for pneumatic springs and electromagnetic actuators of an anti-vibration table, so that even when the moving speed of the movable portion is high, the vibration of the anti-vibration table caused by the movement of the barycenter of the entire anti-vibration table is suppressed, namely, barycenter correction of the anti-vibration table is realized.

The present invention is not limited to the above embodiments and various changes and modifications can be made within the spirit and scope of the present invention. Therefore, to apprise the public of the scope of the present invention, the following claims are made.

What is claimed is:

1. An anti-vibration apparatus comprising:

a table;

a pneumatic spring for applying a force to said table;

an electromagnetic actuator for applying a force to said table; and a first generator which generates a driving signal for said electromagnetic actuator based on at least one of a target position and a target speed of a movable object which is supported by said table and movable relative to said table.

2. An apparatus according to claim 1, further comprising a second generator which generates a signal for changing a pressure in said pneumatic spring based on at least one of the target position and the target speed.

3. An apparatus according to claim 2, wherein said second generator includes a filter which filters a signal corresponding to at least one of the target position and the target speed.

4. An apparatus according to claim 3, wherein a cutoff frequency of said filter has a value within a controllable frequency range of said pneumatic spring.

5. An apparatus according to claim 1, wherein said first generator includes a filter which filters a signal corresponding to at least one of the target position and the target speed.

6. An apparatus according to claim 5, wherein a cutoff frequency of said filter has a value within a controllable frequency range of said pneumatic spring.

7. An exposure apparatus for exposing a substrate to a pattern, said apparatus comprising an anti-vibration apparatus defined in claim 1.

8. An apparatus according to claim 7, further comprising a movable stage as the movable object.

9. A device manufacturing method comprising:

a step of exposing a substrate to a pattern using an exposure apparatus defined in claim 7.

10. A device manufacturing method comprising:

a step of exposing a substrate to a pattern using an anti-vibration apparatus defined in claim 1.

* * * * *